US012550661B2

(12) United States Patent
Kim et al.

(10) Patent No.: US 12,550,661 B2
(45) Date of Patent: Feb. 10, 2026

(54) APPARATUS FOR TREATING SUBSTRATE

(71) Applicant: SEMES CO., LTD., Cheonan-si (KR)

(72) Inventors: Tae Shin Kim, Suwon-si (KR); Young Dae Chung, Incheon (KR); Won-Geun Kim, Goyang-si (KR); Jee Young Lee, Suwon-si (KR); Ji Hoon Jeong, Hwaseong-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 280 days.

(21) Appl. No.: 18/147,400

(22) Filed: Dec. 28, 2022

(65) Prior Publication Data
US 2023/0207350 A1    Jun. 29, 2023

(30) Foreign Application Priority Data

Dec. 28, 2021    (KR) .................. 10-2021-0189944

(51) Int. Cl.
*H01L 21/67* (2006.01)
*H01L 21/687* (2006.01)

(52) U.S. Cl.
CPC .......... *H01L 21/67115* (2013.01); *H01L 21/67051* (2013.01); *H01L 21/6708* (2013.01); *H01L 21/6715* (2013.01); *H01L 21/67248* (2013.01); *H01L 21/68764* (2013.01)

(58) Field of Classification Search
None
See application file for complete search history.

(56) References Cited

U.S. PATENT DOCUMENTS

| 2012/0067864 A1* | 3/2012 | Kusuda | H01L 21/67115 219/385 |
| 2014/0330422 A1* | 11/2014 | Ranish | H01L 21/67115 700/121 |
| 2021/0060625 A1* | 3/2021 | Shin | B08B 7/0042 |

FOREIGN PATENT DOCUMENTS

| KR | 10-1003508 | | 12/2010 |
| KR | 10-2020-0095818 | A | 8/2020 |
| KR | 10-2021-0027761 | A | 3/2021 |
| KR | 10-2021-0047010 | A | 4/2021 |
| KR | 102338512 | B1 | 12/2021 |

OTHER PUBLICATIONS

Translation of KR101003508 by Lee, published Dec. 29, 2010.*
Office Action for Korean Application No. 10-2021-0189944 dated Aug. 29, 2023.

* cited by examiner

*Primary Examiner* — Kaj K Olsen
*Assistant Examiner* — Ryan L Coleman
(74) *Attorney, Agent, or Firm* — Harness, Dickey & Pierce, P.L.C.

(57) ABSTRACT

Provided is an apparatus for treating a substrate, which includes: a chamber having a treating space; a substrate support unit supporting and rotating a substrate in the treating space; a liquid supply unit supplying a chemical liquid to the substrate supported on the substrate support unit; a laser irradiation unit irradiating a laser to a bottom of the substrate supported on the substrate support unit; and a laser reflection unit coupled to the laser irradiation unit, and reflecting the laser irradiated and reflected to the bottom of the substrate, in which the laser reflection unit includes a reflection member reflecting the laser reflected from the substrate, and a driving member tilting the reflection member at a predetermined tilt angle.

20 Claims, 10 Drawing Sheets (a)

(a)

APPARATUS FOR TREATING SUBSTRATE

CROSS-REFERENCE TO RELATED APPLICATIONS

This application claims priority to and the benefit of Korean Patent Application No. 10-2021-0189944 filed in the Korean Intellectual Property Office on Dec. 28, 2021, the entire contents of which are incorporated herein by reference.

TECHNICAL FIELD

An exemplary embodiment of the present invention relates to an apparatus for treating a substrate.

BACKGROUND ART

In order to manufacture a semiconductor device or a liquid crystal display, various processes such as photolithography, etching, ashing, ion injection, thin-film deposition, and cleaning are performed on a substrate. Among them, the etching process or the cleaning process is a process of removing an unnecessary region in a thin film formed on the substrate, and a high selection ratio, a high etching rate, and an etching uniformity for a thin film are required, and an etching selection ratio and etching uniformity of a higher level are required with high integration of the semiconductor device.

In general, in the etching process or the cleaning process of the substrate, a chemical treating step, a rinse treating step, and a dry treating step are largely sequentially performed. In the chemical treating step, the thin film formed on the substrate is etching-treated or chemicals for removing foreign substances on the substrate are supplied to the substrate and in the rinse treating step, a rinse liquid such as pure water is supplied onto the substrate. As such, heating of the substrate can be accompanied with treatment of the substrate through a fluid.

SUMMARY OF THE INVENTION

An object of an exemplary embodiment of the present invention is to provide an apparatus for treating a substrate, which can enhance an etching performance.

An object of an exemplary embodiment of the present invention is to provide an apparatus for treating a substrate, which uniformly distributes an etch rate (ER).

An object of an exemplary embodiment of the present invention is to provide an apparatus for treating a substrate, which can heat a substrate by irradiating a laser to the substrate, and effectively control a light distribution.

An object of an exemplary embodiment of the present invention is to provide an apparatus for treating a substrate, which can replenish temperature reduction which is a factor of reduction of the etch rate (ER) for each region on the substrate.

The objects of the present invention are not limited thereto, and other objects, which are not mentioned above, will be apparently appreciated by a person having ordinary skill in the art from the following description.

An exemplary embodiment of the present invention provides an apparatus for treating a substrate. The substrate treating apparatus may includes: a chamber having a treating space; a substrate support unit supporting and rotating a substrate in the treating space; a liquid supply unit supplying a chemical liquid to the substrate supported on the substrate support unit; a laser irradiation unit irradiating a laser to a bottom of the substrate supported on the substrate support unit; and a laser reflection unit coupled to the laser irradiation unit, and reflecting the laser irradiated and reflected to the bottom of the substrate, and the laser reflection unit may include a reflection member reflecting the laser reflected from the substrate, and a driving member tilting the reflection member at a predetermined tilt angle.

The reflection member may be tilted at a positive angle or a negative angle based on a virtual plane parallel to a top of the substrate.

The laser reflected from the substrate may be reflected o the reflection member which is tilted at the positive angle, and irradiated to the substrate.

When the laser reflected from the substrate is reflected on the reflection member which is tilted at the negative angle, the laser may be irradiated to an edge zone of the substrate or a location which deviates from the substrate.

The tilt angle may be provided as a positive angle, the substrate may include a center zone, an edge zone, and a middle zone disposed between the center zone and the edge zone, and as the tilt angle at which the reflection member is tilted at the positive angle is larger, the laser reflected on the reflection member may be concentrated on the center zone of the substrate. The tilt angle may be provided as the negative angle, the substrate includes a center zone, an edge zone, and a middle zone disposed between the center zone and the edge zone, and as the tilt angle at which the reflection member is tilted at the negative angle is larger, the laser reflected on the reflection member may be concentrated and irradiated to be adjacent to the edge zone of the substrate, or irradiated to the outside of the substrate.

The reflection member may include a plurality of reflection members, and the plurality of reflection members may be partially provided to overlap with each other.

The plurality of reflection members may be integrally tilted.

The laser reflection unit may include a monitoring member monitoring a temperature of the substrate at an upper portion of the substrate supported on the substrate support unit, and a controller, and the controller may control the tilt angle of the reflection member according to the temperature of the substrate received from the monitoring member.

When temperature replenishment into the substrate is required, the controller may control the reflection member to be tilted at the positive angle.

The driving member may move the reflection member in a vertical direction.

The driving member may be provided as a hollow motor having a hollow formed therein, and the driving member may rotate the reflection member.

At least a part of the laser irradiation unit may be disposed in the hollow of the hollow motor.

The substrate support unit may include a chuck member having an internal space, and provided in a cylindrical shape in which an upper portion and a lower portion are opened, a window member coupled to a top of the chuck member, and disposed below the substrate supported on the substrate support unit, and a hollow motor coupled to a lower end of the chuck member, the laser irradiation unit may be disposed at a location lower than the lower end of the chuck member, and the laser irradiated from the laser irradiation unit may be irradiated to the bottom of the substrate through the internal space of the chuck member.

An inner diameter of the chuck member may increase toward an upper end of the chuck member from the lower end of the chuck member.

Another exemplary embodiment of the present invention provides an apparatus for treating a substrate. The substrate treating apparatus may include: a chamber having a treating space; a substrate support unit supporting and rotating a substrate in the treating space; a liquid supply unit supplying a chemical liquid to the substrate supported on the substrate support unit; a laser irradiation unit irradiating a first laser to a bottom of the substrate supported on the substrate support unit and heating the substrate; and a laser reflection unit coupled to the laser irradiation unit, and reflecting a second laser reflected to the bottom of the substrate, the laser reflection unit may include a base coupled to an outer surface of the laser irradiation unit, and provided to cover the laser irradiation unit, a reflection member coupled to the base, a driving member tilting the reflection member to the base, and a connection member including a first member coupled to the driving member and a second member connecting the first member and the reflection member, the reflection member may include a plurality of reflection members, and the plurality of reflection members may be coupled along a circumference of the base, and at least some of the plurality of reflection members are disposed to overlap with each other. The plurality of reflection members may be coupled along a circumference of the base, and the tilt angle may include a positive angle or a negative angle based on a virtual plane parallel to a top of the substrate.

The laser reflection unit may include a monitoring member monitoring a temperature of the substrate at an upper portion of the substrate supported on the substrate support unit, and a controller, and the controller may control the tilt angle of the reflection member according to the temperature of the substrate received from the monitoring member, and when temperature replenishment into the substrate is required, the controller may control the reflection member to be tilted at the positive angle.

The substrate may include a center zone, an edge zone, and a middle zone disposed between the center zone and the edge zone, and when the tilt angle is provided as the positive angle, the laser reflected on the reflection member may be irradiated to the bottom, and when the tilt angle is provided as the negative angle, the laser reflected on the reflection member may be irradiated to the edge zone of the substrate or the location which deviates from the substrate.

Yet another exemplary embodiment of the present invention provides a laser irradiation apparatus heating a substrate by irradiating a laser to a bottom of the substrate. The laser irradiation apparatus may include: a laser irradiation member irradiating a laser to a bottom of a substrate; a laser transmission member transmitting the laser to the laser irradiation member; and a laser reflection unit coupled to the laser irradiation member, and reflecting the laser reflected on the bottom of the substrate, and the laser reflection unit may include a base coupled to an outer surface of the laser irradiation member, and provided to cover the laser irradiation unit, a reflection member coupled to the base, a driving member tilting the reflection member to the base at a positive angle or a negative angle, and a connection member including a first member coupled to the driving member and a second member connecting the first member and the reflection member.

According to an exemplary embodiment of the present invention, an etching performance can be enhanced.

According to an exemplary embodiment of the present invention, an etch rate (ER) can be uniformly distributed.

According to an exemplary embodiment of the present invention, a substrate can be heated by irradiating a laser to the substrate, and light distribution can be effectively controlled.

According to an exemplary embodiment of the present invention, temperature reduction which is a factor of reduction of an etch rate (ER) for each region can be replenished.

DETAILED DESCRIPTION

Figure 1:
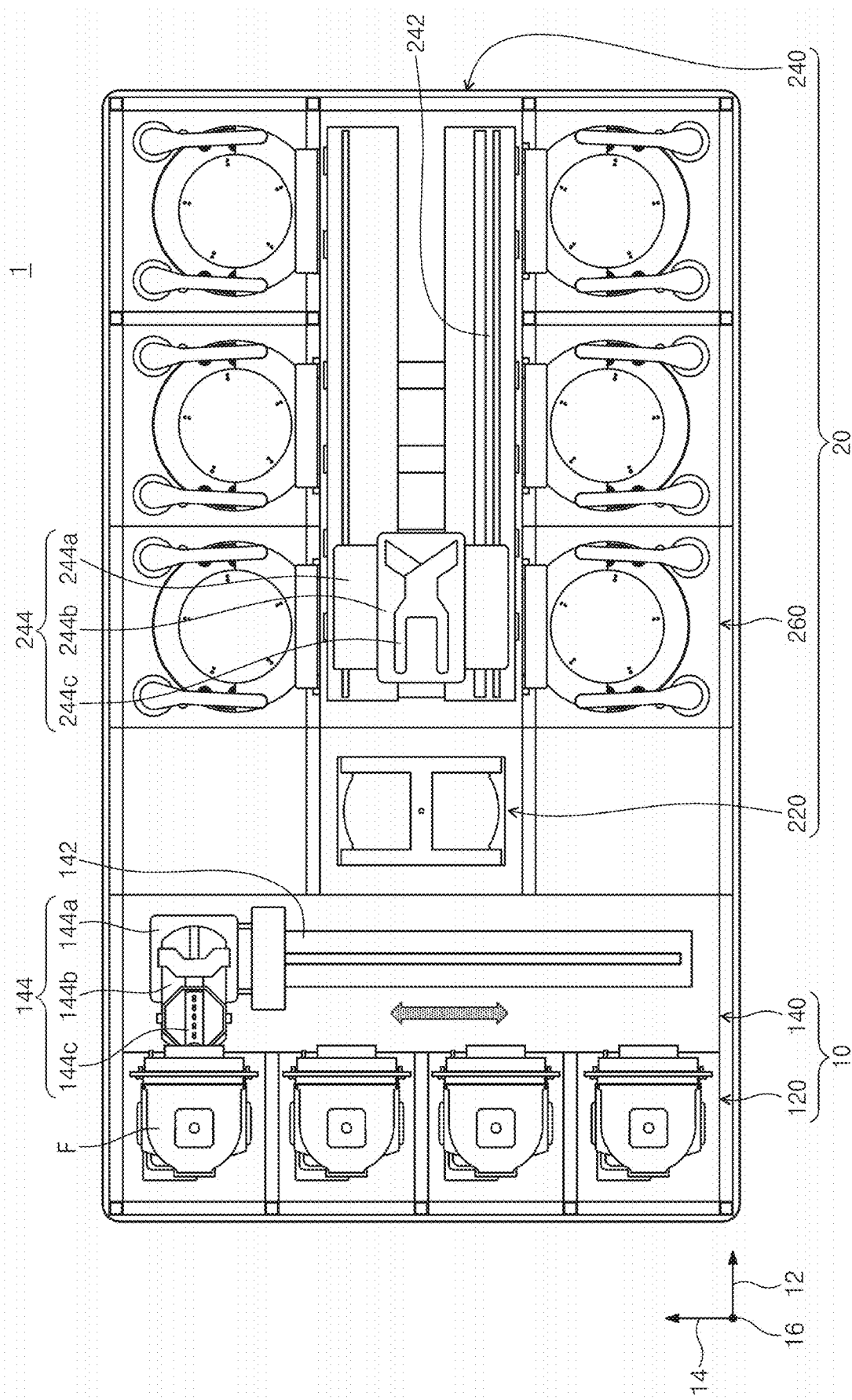
FIG. 1 is a cross-sectional view schematically illustrating a facility for treating a substrate according to an exemplary embodiment of the present invention.

In the following detailed description, exemplary embodiments of the present invention have been shown and described, simply by way of illustration. As those skilled in the art would realize, the described exemplary embodiments may be modified in various different ways, all without departing from the spirit or scope of the present invention. Further, in describing the exemplary embodiment of the present invention, detailed description of associated known function or constitutions will be omitted if it is determined that they unnecessarily make the gist of the present invention unclear. Further, the same reference numeral is used for a part which performs a similar function and a similar action through all drawings.

Unless explicitly described to the contrary, the word "comprise" and variations such as "comprises" or "comprising", will be understood to imply the inclusion of stated elements but not the exclusion of any other elements. Specifically, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

A singular form includes a plural form if there is no clearly opposite meaning in the context. Further, shapes, sizes, and the like of elements in the drawings may be exaggerated for clearer explanation.

The term "and/or" includes any one of the corresponding listed items and all combinations of one or more items. Further, in this specification, the term "connected" means a case where member C is interposed between member A and member B to indirectly connect member A and member B in addition to a case where member A and member B are directly connected. The exemplary embodiment of the present invention can be modified in various forms, and it should not be construed that the scope of the present invention is limited to exemplary embodiments described below. The exemplary embodiments are provided to more completely describe the present invention to those skilled in the art. Therefore, a shape of an element in the drawing is exaggerated in order to emphasizing a more definite description.

In the exemplary embodiment, a process of etching-treating a substrate by using a treatment liquid is described as an example. However, the exemplary embodiment is not limited to an etching process, and is variously applicable to a substrate treating process using a liquid, such as a cleaning process, an ashing process, and a development process.

Here, the substrate is a comprehensive concept including all substrates used for manufacturing a semiconductor device or a flat panel display (FPD), and a product in which a circuit pattern is formed in other thin films. An example of the substrate W includes a silicon wafer, a glass substrate, an organic substrate, etc.

Hereinafter, an exemplary embodiment of the present invention will be described in detail with reference to drawings.

FIG. 1 is a cross-sectional view schematically illustrating a facility for treating a substrate according to an exemplary embodiment of the present invention.

Referring to FIG. 1, the substrate treating facility 1 includes an index module 10 and a process treating module 20. The index module 10 has a load port 120 and a transfer frame 140. The load port 120, the transfer frame 140, and the process treating module 20 may be sequentially arranged in line. Hereinafter, a direction in which the load port 120, the transfer frame 140, and the process treating module 20 are arranged will be referred to as a first direction 12, a direction vertical to the first direction when viewed from the top will be referred to as a second direction 14, and a direction vertical to both the first direction 12 and the second direction 14 will be referred to as a third direction 16.

A carrier F storing the substrate W may be seated on the load port 120. A plurality of load ports may be provided, and arranged in the second direction 14. In FIG. 1, it is illustrated that four load ports 120 are provided, but the number of load ports 120 may increase or decrease according to conditions such as process efficiency and a footprint of the process treating module 20. A slot (not illustrated) provided to support an edge of the substrate may be formed in the carrier F. A plurality of slots may be provided in the third direction 16, and the substrates may be arranged in the carrier F to be stacked to be spaced apart from each other in the third direction 16. A front opening unified pod (FOUP) may be used as the carrier F. The transfer frame 140 may transfer the substrate W between a carrier 18 and a buffer unit 220 seated on the load port 120. An index rail 142 and an index robot 144 may be provided in the transfer frame 140. The index rail 142 may be provided so that a longitudinal direction is in line with the second direction 14. The index robot 144 may be installed on the index rail 142. The index robot 144 may linearly move in the second direction 14 along the index rail 142. The index robot 144 may include a base 144a, a body 144b, and an index arm 144c. The base 144a may be installed to be movable along the index rail 142. The body 144b is coupled to the base 144a. The body 144b may be provided to be movable in the third direction 16 on the base 144a. Further, the body 144b may be provided to be rotatable on the base 144a. The index arm 144c may be provided to be coupled to the body 144b, and to be movable forward and backward with respect to the body 144b. A plurality of index arms 144c may be provided to be provided and respectively individually driven. The index arms 144c may be arranged to be stacked while being spaced apart from each other in the third direction 16. Some of the index arms 144c may be used when transferring the substrate W from the process treating module 20 to the carrier F, and other some may be used when transferring the substrate W from the carrier F to the process treating module 20. This is to prevent particles generated from the substrate W before process treating from being attached to the substrate W after process treating in the process of loading and unloading the substrate W.

The process treating module 20 includes a buffer unit 220, a transfer chamber 240, and a process chamber 260.

The buffer unit 220 may be arranged between the transfer frame 140 and the transfer chamber 240. The buffer unit 220 may provide a space which the substrate W stays before the substrate W is transferred between the transfer chamber 240 and the transfer frame 140. A slot (not illustrated) in which the substrate W is placed may be provided inside the buffer unit 220, and a plurality of slots (not illustrated) may be provided to be spaced apart from each other in the third direction 16. In the buffer unit 220, each of a surface facing the transfer frame 140 and a surface facing the transfer chamber 240 may be opened.

The transfer chamber 240 may transfer the substrate W between the buffer unit 220 and the process chambers 260. A guide rail 242 and a main robot 244 may be provided in the transfer chamber 240. The guide rail 242 may be arranged so that the longitudinal direction is in line with the first direction 12. The main robot 244 may be installed on the guide rail 242, and linearly moved in the first direction 12 on the guide rail 242.

The transfer chamber 240 may be arranged so that the longitudinal direction of is parallel to the first direction 12. The process chambers 260 may be arranged at both sides of the transfer chamber 240. The process chambers 260 may be provided to be symmetric to each other based on the transfer chamber 240. Some of the processor chambers 260 may be arranged in the longitudinal direction of the transfer chamber 240. Further, some of the process chambers 260 may be arranged to be stacked on each other. That is, the process chambers 260 may be arranged at both sides of the transfer chamber 240 in an array of A×B (each of A and B is a natural number of 1 or more). Here, A represents the number of process chambers 260 provided in line in the first direction 12, and B represents the number of process chambers 260 provide din line in the third direction 16. When 4 or 6 process chambers 260 are provided at each of both sides of the transfer chambers 240, the process chambers 260 and 280 may be arranged in a array of 2×2 or 3×2. The number of process chambers 260 may also increase or decrease.

Unlike the above description, the process chamber 260 may be provided only at one side of the transfer chamber 240. Further, the process chamber 260 may be provided as a single layer at one side and the other side of the transfer chamber 240. Unlike the above description, the process chamber 260 may be provided in various arrangements.

The same process in the process chamber 260 arranged at one side of the transfer chamber 240 may be performed as the process in the process chamber 260 arranged at the other side of the transfer chamber 240. As an example, a process of liquid-treating the substrate W may be performed in the process chamber 260. Alternatively, a different process in the process chamber 260 arranged at one side of the transfer chamber 240 may be performed from the process in the process chamber 260 arranged at the other side of the transfer chamber 240. As an example, a liquid-treating process may be performed in the process chamber 260 arranged at one side of the transfer chamber 240, and a substrate dry treating process may be performed in the process chamber 260 arranged at the other side 280 of the transfer chamber 240. Hereinafter, a substrate treating apparatus 400 provided in the process chamber 260 will be described.

The substrate treating apparatus 300 performing the liquid treating process for the substrate W is provided in the process chamber 260. The substrate treating apparatus 300 may have a different structure according to the type of performed liquid treating process. Unlike this, the substrate treating apparatuses 300 in the respective process chambers 260 may have the same structure. Optionally, the plurality of process chambers 260 are distinguished into a plurality of groups, and substrate treating apparatuses 300 in process chambers 260 which belong to the same group may be the same as each other, and structures of substrate treating apparatuses 300 in process chambers 260 which belong to different groups may be provided to be different from each other.

Figure 2:
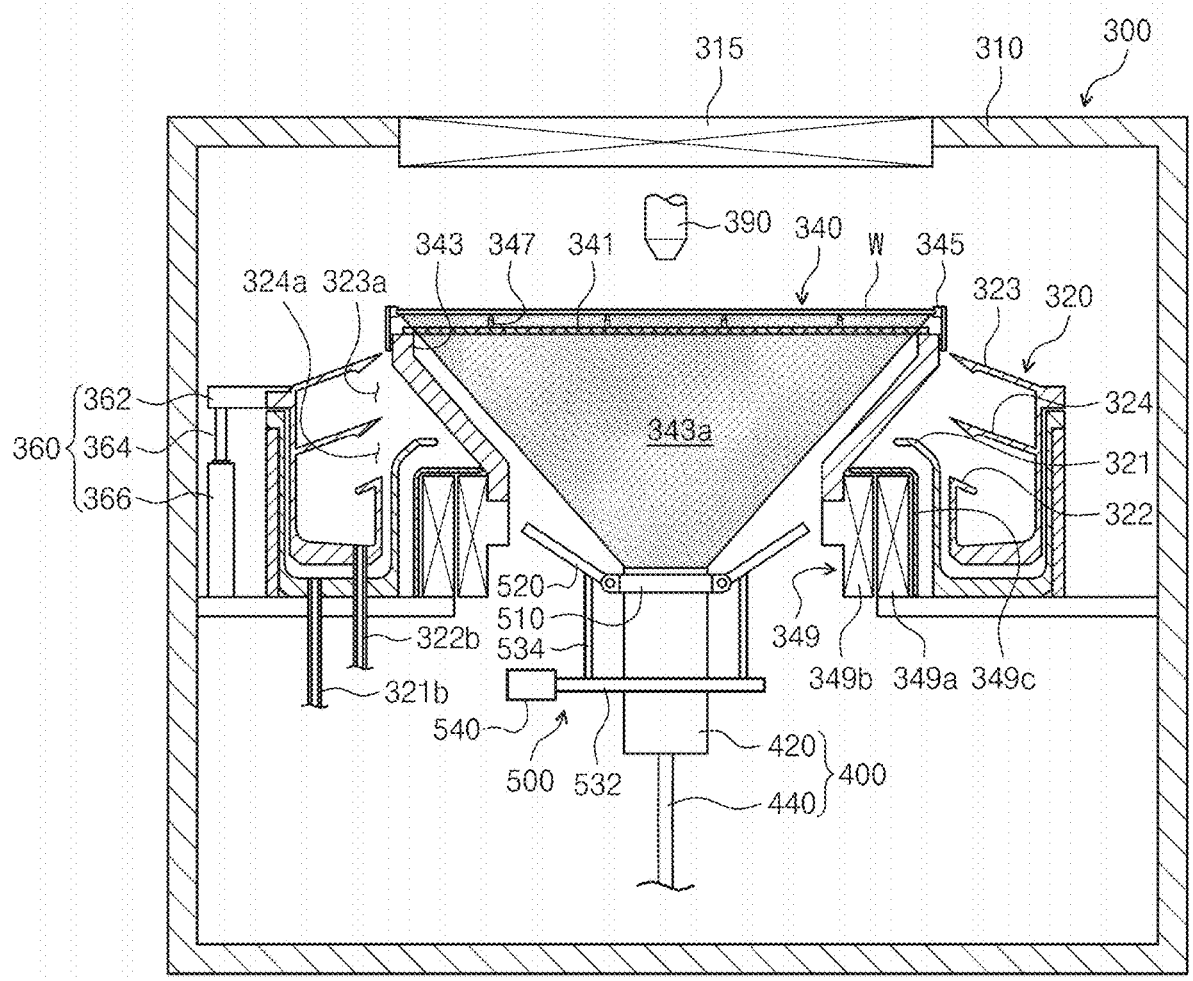
FIG. 2 is a cross-sectional view illustrating an apparatus for treating a substrate provided in a process chamber of FIG. 1.

FIG. 2 is a cross-sectional view illustrating an apparatus for treating a substrate provided in a process chamber of FIG. 1.

Referring to FIG. 2, the substrate treating apparatus 300 may include a chamber 310. The chamber 310 may have an internal space. The treating container 320 may be arranged in the internal space of the chamber 310. A fan filter unit 315 may be installed on a top wall of the chamber 310. The fan filter unit 315 may form a vertical air current in the internal space of the chamber 310. The fan filter unit 315 may form a descending air current in the internal space of the chamber 310. The fan filter unit 315 may be a device in which a filter and an air supply fan are modularized into one unit, and which filters high-humidity outdoor air and supplies the filtered outdoor air to the inside of the chamber 310. The high-humidity outdoor air may be supplied to the internal space of the chamber 310 by passing through the fan filter unit 315, and may form the vertical air current in the internal space of the chamber 310. The vertical air current may provide a uniform air current to the upper portion of the substrate W. Contaminated substances (e.g., fumes and particles) generated in the process of treating the substrate W may be discharged to the outside of the treating container 320 jointly with air included in the vertical air current, and thus the inside of the treating container 320 may maintain high clearness.

Referring to FIG. 2, the substrate treating apparatus 300 may include the treating container 320. The treating container 320 may have a cup shape of which upper portion is opened. The treating container 320 may cover the substrate support unit 340. The treating container 320 may be provided at the outer side of the substrate support unit 340. The treating container 320 may include a first recovery tank 321 and a second recovery tank 322. The first and second recovery tanks 321 and 322 may recover different treatment liquids among a plurality of treatment liquids used in the respective processes.

The first recovery tank 321 may be provided in an annular ring shape of covering the substrate support unit 340. The first recovery tank 321 may have a space therein. The space of the first recovery tank 321 may be a space accommodating the recovered treatment liquid. The second recovery tank 322 may be inserted into the first recovery tank 321. The first recovery tank 321 may be provided in a ring shape of covering the second recovery tank 322. The second recovery tank 322 may be provided in the annular ring shape of covering the substrate support unit 340. The second recovery tank 322 may be inserted into the first recovery tank 321. A height of the second recovery tank 322 may be provided to be higher than the first recovery tank 321.

The second recovery tank 322 may include a first guard unit 323 and a second guard unit 324. The first guard unit 323 may be provided at an uppermost portion of the second recovery tank 322. The first guard unit 323 may be formed to extend toward the substrate support unit 340 from the uppermost portion of the second recovery tank 322. The first guard unit 323 may be formed to be inclined upward toward the substrate support unit 340. The second guard unit 324 may be provided below the first guard unit 323. The second guard unit 324 may be spaced apart from the first guard unit 323. The second guard unit 324 may be formed to extend toward the substrate support unit 340. The second guard unit 324 may be formed to be inclined upward toward the substrate support unit 340. The second guard unit 324 may be formed in a shape corresponding to the first guard unit 323. The second guard unit 324 may be provided in parallel to the first guard unit 323.

A first introduction hole 323 through which the treatment liquid is introduced may be provided between the first guard unit 323 and the second guard unit 324. A second introduction hole 324a may be provided at a lower portion of the second guard unit 324. The first introduction hole 323a and the second introduction hole 324a may be positioned at different heights. A hole (not illustrated) may be formed in the second guard unit 324. In the hole (not illustrated) of the second guard unit 324, the treatment liquid introduced into the first introduction hole 323a may flow to a second recovery line 322b provided at the lower portion of the second recovery tank 322. The hole (not illustrated) of the second guard unit 324 may be formed at a location having a lowest height in the second guard unit 324. The treatment liquid recovered to the first recovery tank 321 may flow to the first recovery line 321b connected to the bottom of the first recovery tank 321. The treatment liquids introduced into the first and second recovery tanks 321 and 322, respectively may be provided in an external treatment liquid reproduction system (not illustrated), and reused through the first and second recovery lines 321b and 322b.

Referring to FIG. 2, the substrate treating apparatus 300 may include an elevation unit 360. The elevation unit 360 may move the treating container 320 in the vertical direction. The elevation unit 360 may elevate the treating container 320 in the vertical direction. The elevation unit 360 may linearly move the treating container 320 in the vertical direction. The elevation unit 360 may be coupled to the treating container 320. The elevation unit 360 may be coupled to the second recovery tank 322 of the treating container 320. The elevation unit 360 may be coupled between the first guard unit 323 and the second guard unit 324 of the second recovery tank 322. The elevation unit 360 may be coupled between the second recovery tank 322 at a location closer to the first guard unit 323 than the second guard unit 324. The elevation unit 360 may move the second recovery tank 322 in the vertical direction. Through this, a relative height of the treating container 320 may be changed with respect to the substrate support unit 340.

The elevation unit 360 may include a bracket 362, a movement axis 364, and a driver 366. The bracket 362 may be coupled to an outer wall of the treating container 320. The bracket 362 may be coupled to the outer wall of the second recovery tank 322. The bracket 362 may be coupled between the first guard unit 323 and the second guard unit 324 of the second recovery tank 322. The bracket 362 may be coupled to the outer wall of the second recovery tank 322 at the location closer to the first guard unit 323 than the second guard unit 324. The bracket 362 may be coupled to the movement axis 364 moved in the vertical direction by the driver 366. One end of the movement axis 364 may be coupled to the bracket 362, and the other end may be coupled to the driver 366. The movement axis 364 may receive driving force from the driver 366. The movement axis 364 may be provided to be movable in the vertical direction. The movement axis 364 may be moved in the vertical direction by receiving the driving force from the driver 366. In this case, the bracket 362 coupled to the movement axis 364 and the treating container 362 coupled to the bracket 362 may also be moved jointly. The driving 366 may be coupled to the movement axis 364. The driver 366 may transmit the driving force to the movement axis 364. For example, the driver 366 may be provided as a motor or a cylinder. However, the present invention is not limited thereto, and various components may be applied and used, which are capable of driving the driving force to the movement axis 364.

The elevation unit 360 may move the treating container 320 downward so that the upper portion of the substrate support unit 340 protrudes above the treating container 320 when the substrate W is loaded to the substrate support unit 340 or unloaded from the substrate support unit 340. The elevation unit 360 may move the second recovery tank 322 downward so that the upper portion of the substrate support unit 340 protrudes above the first guard unit 323 of the second recovery tank 322 when the substrate W is loaded to the substrate support unit 340 or unloaded from the substrate support unit 340. When the process is conducted, the elevation unit 360 may control the height of the treating container 320 so that the treatment liquid may be introduced into predetermined recovery tanks 321 and 322 according to the type of treatment liquid supplied to the substrate W. Optionally, the elevation unit 360 may be coupled to the substrate support unit 340, and may move the substrate support unit 340 in the vertical direction instead of the treating container 320. Optionally, the elevation unit 360 may also move the entirety of the treating container 320 in the vertical direction. The elevation unit 360 is provided to control relative heights of the treating container 320 and the substrate support unit 340, and if a component is provided, which is capable of controlling the relative heights of the treating container 320 and the substrate support unit 340, an exemplary embodiment of the training container 320 and the elevation unit 360 may be provided by various structures and methods.

Referring to FIG. 2, the substrate treating apparatus 300 may include the substrate support unit 340. The substrate support unit 340 may support the substrate W during the progress of the process. The substrate support unit 340 may rotate the substrate W during the progress of the process.

The substrate support unit 340 may include a window member 341. The window member 341 may be provided with a material having high transmittance. As a result, a laser irradiated by a laser irradiation unit 400 to be described below may transmit the window member 341. The window member 341 may be a material having excellent corrosion resistance which does not act with a chemical liquid. For example, the window member 341 may be provided as quartz, glass, or sapphire.

The window member 341 may be placed below the substrate W supported on the substrate support unit 340. The window member 341 may be provided in a disc shape. The window member 341 may have a shape corresponding to the substrate W. For example, when the substrate W is a circular wafer, the window member 341 may be provided in a substantially circular shape. The window member 341 may have a diameter smaller than the diameter of the substrate W. However, the window member 341 is not limited thereto, and the window member 341 may be formed to have the same diameter as the substrate W or have a lager diameter than the substrate W. The window member 341 may be supported by a chuck member 343 to be described below. The window member 341 may be coupled to an upper end of the chuck member 343.

The substrate support unit 340 may include the chuck member 343. The chuck member 343 may be provided below the window member 341. The chuck member 343 may be provided on the bottom of the window member 341. The chuck member 343 may support an edge region of the window member 341.

The chuck member 343 may be provided in a cylindrical shape in which the upper end and the lower end are opened. The chuck member 343 may be provided in the cylindrical shape. The chuck member 343 may include an internal space 343a in which the inside is penetrated in the vertical direction. The chuck member 343 may have an inner diameter which increases upward the upper end of the chuck member 343 from the lower end of the chuck member 343. When viewed on the cross section, the chuck member 343 may be formed to be inclined upward toward the upper end of the chuck member 343 from the lower end of the chuck member 343. The chuck member 343 may be provided in the cylindrical shape in which the inner diameter increases toward the upper end of the chuck member 343 from the lower end of the chuck member 343. The upper end of the chuck member 343 may support the edge region of the window member 341. The lower end of the chuck member 343 may be coupled to a driving member 349 to be described below. The chuck member 343 may be rotated by the driving member 349. The chuck member 343 may be rotated in a clockwise direction or a counterclockwise direction by the driving member 349. The lower end of the chuck member 343 may be adjacent to the laser irradiation unit 400 to be described below. With respect to the chuck member 343, the laser irradiated by the laser irradiation unit 400 may be interfered by the chuck member 343, but irradiated to the substrate W by the internal space 343a. A connection portion of the chuck member 343 and the window member 341 may be provided in a sealing structure. Through this, the chemical liquid supplied to the substrate W may not permeate into the internal space 343a of the chuck member 343. Further, the chemical liquid supplied to the substrate W may not permeate into the laser irradiation unit 400.

The substrate support unit 340 may include a chuck pin 345. The chuck pin 345 may support a side portion of the substrate W. The chuck pin 345 may be coupled to the window member 341. The chuck pin 345 may be movably coupled to the window member 341. The chuck pin 345 may be moved between the process location contacting the side portion of the substrate W and the waiting location spaced apart from the side portion of the substrate W. The chuck pin 345 may move between the process location and the waiting location in the horizontal direction. The chuck pin 345 may be rotated jointly with the window member 341. The chuck pin 345 may include a plurality of chuck pins 345. The plurality of chuck pins 345 may be combined and disposed in the ring shape. The chuck pin 345 may be provided at an outer side than a support pin 347 to be described below. A radius of a ring formed by combining the plurality of chuck pins 345 may be larger than a radius of the ring formed by combining the plurality of support pins 347.

The substrate support unit 340 may include the support pin 347. The support pin 347 may be connected to the window member 341. The support pin 347 may be provided in a plural number. The plurality of support pins 347 may be provided at the edge region of the window member 341. The plurality of support pins 347 may be arranged to be spaced apart from each other along the edge region of the window member 341. The plurality of support pins 347 may be arranged in the ring shape in combination with each other. The support pin 347 may be provided to protrude upward from the top surface of the window member 341. The support pin 347 supports the bottom surface of the substrate W to make the substrate W be spaced apart from the window member 341. The support pin 347 may be provided at an inner side than the chuck pin 345.

The substrate support unit 340 may include the driving member 349. The driving member 349 may be coupled to the chuck member 343. The driving member 340 may be coupled to the lower end of the chuck member 343. The driving member 340 may rotate the chuck member 341. The driving member 349 may be provided as a hollow motor. The driving member 349 may include a stator 349a and a rotor 349b. The stator 349a may be fixed and provided at one location, and the rotor 349b may be coupled to the chuck member 341. The driving member 349 may be provided as the hollow motor in which the rotor 349b is provided in an inner diameter and the stator 349a is provided in an outer diameter. The rotor 349b is coupled to the lower end of the chuck member 341 to rotate the chuck member 341. When the driving member 349 is provided as the hollow motor, the hollow motor may be selected which has a small hollow even though the lower end of the chuck member 341 is provided to be narrow, so manufacturing cost may be reduced and spatial efficiency may be increased. According to an exemplary embodiment, the stator 349a of the driving member 349 may be provided while being fixedly coupled to a support surface supported by the treating container 320. According to an exemplary embodiment, a cover member 349c protecting the driving member 349 from the chemical liquid may be provided in the driving member 349.

Hereinabove, it is described that the driving member 349 is provided as the hollow motor, but the present invention is not limited thereto, and even any driving member 349 may be used which may rotate the chuck member 341.

Referring to FIG. 2, the substrate treating apparatus 300 may include a liquid supply unit 390. The liquid supply unit 390 may supply the chemical liquid to the substrate W. The liquid supply unit 390 may supply the chemical liquid to the substrate W supported on the substrate support unit 340. The liquid supply unit 390 may supply the chemical liquid to the substrate W above the substrate W. The liquid supply unit 390 may include a nozzle ejecting the chemical liquid to the substrate W. The liquid supply unit 390 may include one or more nozzles. The liquid supply unit 390 may include a nozzle moving member (not illustrated) capable of supporting the nozzle and moving the nozzle. The nozzle moving member (not illustrated) may include a support axis (not illustrated), an arm (not illustrated), and a driver (not illustrated). The support axis (not illustrated) may be disposed at one side of the treating container 320. The support axis (not illustrated) may have a rod shape in which the longitudinal direction faces the third direction. The support axis (not illustrated) may be provided to be rotatable by the driver (not illustrated). The arm (not illustrated) may be coupled to an upper end of the support axis (not illustrated). The arm (not illustrated) may be formed to extend in a direction vertical to the longitudinal direction of the support axis (not illustrated). The nozzle may be fixedly coupled to the end of the arm (not illustrated). As the support axis (not illustrated) rotates, the nozzle may swingably move jointly with the arm (not illustrated). The nozzle may move swingably to move to the process location and the waiting location. The process location may mean a location opposite to a central portion of the substrate W, and the waiting location may mean a location where the nozzle deviates from the substrate. Optionally, the support axis (not illustrated) may be provided to move elevatably. Further, the arm (not illustrated) may be provided to move forward and backward in the longitudinal direction of the arm (not illustrated).

The chemical liquid supplied from the liquid supply unit 390 to the substrate W may be diversified according to a substrate treating process. When the substrate treating process is a silicon nitride layer etching process, the chemical liquid may be a chemical liquid containing phosphoric acid ($H_3PO_4$). The liquid supply unit 390 may further include a deionized water (DIW) supply nozzle for rinsing the substrate surface after conducting the etching process, an isopropyl alcohol (IPA) ejection nozzle for conducting the drying process after rinsing, and a nitrogen ($N_2$) ejection nozzle.

Referring to FIG. 2, the substrate treating apparatus 300 may include the laser irradiation unit 400. The laser irradiation unit 400 may irradiate the laser to the substrate W. The laser irradiation unit 400 may irradiate the laser to the bottom of the substrate W supported on the substrate support unit 340. The laser irradiated by the laser irradiation unit 400 may be irradiated to the bottom of the substrate W by passing through the window member 341. As a result, the substrate W may be heated at a set temperature. The laser irradiation unit 400 may include a laser irradiation member 420 and a laser transmission member 440.

The laser irradiation member 420 may be provided below the window member 341. The laser irradiation member 420 may be provided at a location adjacent to the lower end of the chuck member 343. The laser irradiation member 420 may be provided at a location lower than the lower end of the chuck member 343. The laser irradiation member 420 may be provided at a location opposite to the central portion of the substrate W. The laser irradiation member 420 may irradiate the laser transmitted through the laser transmission member 440 to be described below. The laser irradiation member 420 may irradiate the laser to the substrate W. The laser irradiation member 420 may irradiate the laser to the bottom of the substrate W. The laser irradiation member 420 may heat the substrate W by irradiating the laser to the substrate W. The laser irradiation member 420 may include a housing 422 having a space formed therein, and a lens module (not illustrated) coupled to the internal space of the housing 422. The lens module (not illustrated) may include a single lens or a plurality of lenses. The laser transmission member 440 may connect a laser generator (not illustrated) positioned outside the substrate treating apparatus 300 and the laser irradiation member 420. The laser transmission member 440 may transmit the laser generated by the laser generator (not illustrated) to the laser irradiation member 420. As an example, the laser transmission member 440 may be an optical fiber.

Figure 3:
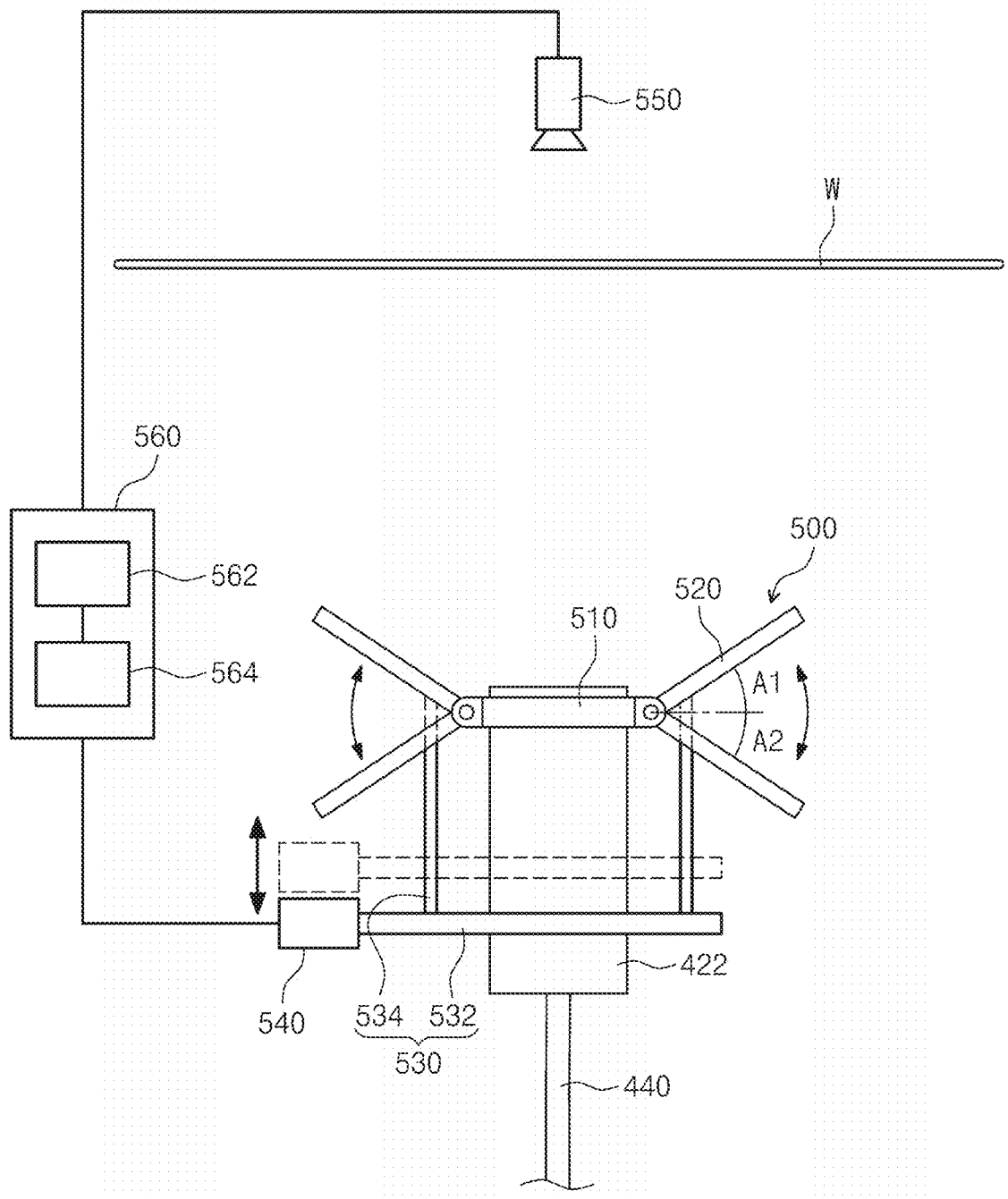
FIG. 3 is a diagram illustrating a laser irradiation unit and a laser reflection unit according to an exemplary embodiment of the present invention.

Referring to FIG. 2, the substrate treating apparatus 300 may include a laser reflection unit 500. The laser irradiation unit 500 is coupled to the laser irradiation unit 400 to control the path of the laser. The laser reflection unit 500 may control the path of a laser (hereinafter, referred to as a second laser L2) reflected on the bottom of the substrate W in the laser (hereinafter, referred to as a first laser L1) irradiated to the substrate W by the laser irradiation unit 400. FIG. 3 is a diagram illustrating a laser irradiation unit and a laser reflection unit according to an exemplary embodiment of the present invention and FIG. 4 is a diagram schematically illustrating the laser reflection unit of FIG. 3.

Referring to FIG. 3, the laser reflection unit 500 may be coupled to the laser irradiation unit 400. The laser reflection unit 500 may be coupled to the laser irradiation member 420. The laser irradiation unit 500 may be coupled to an outer surface of the housing 422 of the laser irradiation member 420. The laser reflection unit 500 may be provided at a location adjacent to the upper end of the housing 422.

Figure 4:
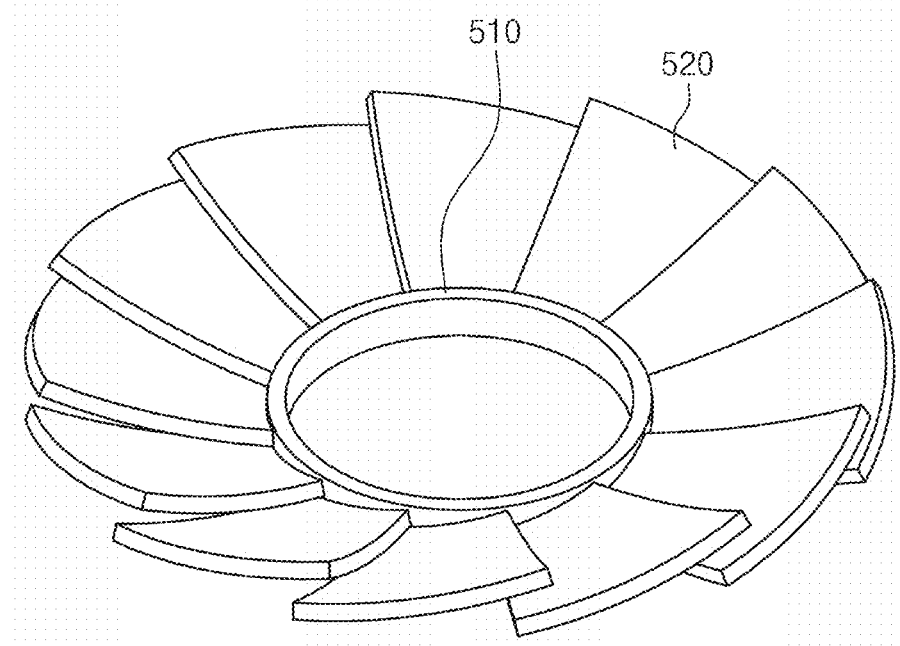
FIG. 4 is a diagram schematically illustrating the laser reflection unit of FIG. 3.

Referring to FIGS. 3 and 4, the laser reflection unit 500 may include a base 510. The base 510 may be coupled to the housing 422 of the laser irradiation member 420. The base 510 may be coupled to the housing 422 at the location adjacent to the upper end of the housing 422 of the laser irradiation member 420. According to an example, the top surface of the base 510 may be positioned on the same plane as the top surface of the housing 422. According to an example, the top surface of the base 510 may be positioned at a location lower than the top surface of the housing 422. A hole penetrating the top surface and the bottom surface may be formed in the base 510. The base 510 may be provided in the ring shape in which the hole is formed therein. At least a part of the laser irradiation member 420 may be inserted into the hole of the base 510. The laser irradiation member 420 may penetrate the hole of the base 510. An inner surface of the hole of the base 510 may be in contact with the outer surface of the housing 422 of the laser irradiation member 420. However, the present invention is not limited thereto, and the inner surface of the hole of the base 510 may be disposed to be spaced apart from the outer surface of the housing 422 of the laser irradiation member 420 by a predetermined interval. A reflection member 520 to be described below may be coupled to the base 510.

Referring to FIGS. 3 and 4, the laser reflection unit 500 may include the reflection member 520. The reflection member 520 may be coupled to the base 510. The reflection member 520 may be movably coupled to the base 510. The reflection member 520 may be movably coupled with a point where the reflection member 520 and the base 510 contact as the axis. The other end of the reflection member 520 may be movably coupled to the base 510 with the point where the reflection member 520 and the base 510 contact as the axis. The reflection member 520 may be tiltably coupled to the base 520. The reflection member 520 may be tiltably coupled to the base 520. The reflection member 520 may be tiltable by the driving member 540 to be described below. The reflection member 520 may be tilted through the driving member 540 and a connection member 530 to be described below. One end of the reflection member 520 may be coupled to the base 510, and the other end positioned at an opposite side to one end of the reflection member 520 may be provided as a free end. According to an example, one end of the reflection member 520 may be pin-coupled to the base 510. However, the reflection member 520 is not limited thereto, and the reflection member 520 may be provided to be tiltable with respect to the base 510 by various coupling schemes.

The reflection member 520 may include a plurality of reflection members 520. The plurality of reflection members 520 may be coupled along the outer surface of the base 510. The plurality of reflection members 520 may be coupled along a circumference of the base 510. The plurality of reflection members 520 may partially overlap with each other. As the plurality of reflection members 520 are provided to partially overlap with each other, a reflection rate of the laser may be increased.

The reflection member 520 may be provided with a material capable of reflecting the laser. As an example, the reflection member 520 may be provided as a reflector.

The reflection member 520 may control the path of the laser L2 reflected on the bottom of the substrate W in the laser irradiated to the substrate W by the laser irradiation unit 400. The reflection member 520 may reflect the second laser L2. The laser reflected by the reflection member 520 may be referred to as a third laser L3. The laser L3 reflected by the reflection member 520 may moved toward the substrate W. The path of the third laser L3 may be controlled according to a tilt angle of the reflection member 520. For example, the third laser L3 may be concentrated on any one zone of a center zone of the substrate W, an edge zone of the substrate W, and a middle zone disposed between the center zone and the edge zone of the substrate W. Through this, the amount of light may be replenished in a zone requiring a temperature replenishment among the respective zones of the substrate W.

In general, a structure of heating the substrate with the laser, a reflector fixed to a specific location may be used in order to return a laser beam reflected on the bottom and returned to the substrate again. In this case, since it is impossible to change an optical path of the laser beam reflected by the reflector due to fixation of the reflector, it is difficult to selectively concentrate light on the zone requiring the temperature replenishment of the substrate, so it is difficult to obtain a uniform etch rate.

However, according to the exemplary embodiment of the present invention, as the reflection member 520 that reflects the laser beam reflected on the substrate W and returned is provided to be variably tiltable, loss replenishment of the laser beam may be possible on the bottom of the substrate W. Further, as the optical path of the third laser L is changed so that the laser beam is concentrated on a zone having a lower temperature among the zones of the substrate W, it is possible to secure the uniform etch rate. Further, it is possible to replenish the temperature in an entire zone from the center zone up to the edge of the substrate W by controlling an angle value of the reflection member 520 which is variably tiltable. Referring to FIG. 3, the reflection member 520 may be tilted at a predetermined angle based on a virtual surface parallel to the top surface of the substrate W.

Hereinabove, it is illustrated and described that the reflection member 520 is coupled to the base 510, but the present invention is not limited thereto, and the laser reflection unit 500 may not include the base 510, and the reflection member 520 may be coupled to the housing 422 of the laser irradiation member 420.

Referring to FIGS. 3 and 4, the laser reflection unit 500 may include the connection member 530. The connection member 530 may tilt the reflection member 520 by receiving power from the driving member 540 to be described below. The connection member 530 may move the other end of the reflection member 520 in the vertical direction by receiving the power from the driving member 540 to be described below. The connection member 530 may include a first member 532 coupled to the driving member 540 to be described below and a second member 534 connecting the first member 532 and the reflection member 520. One end of the second member 534 may be coupled to the reflection member 520, and the other end of the second member 534 may be coupled to the first member 532. The second member 534 may be coupled to the bottom of the reflection member 520. The second member 534 may be coupled to the center zone on the bottom of the reflection member 520. However, the second member 534 is not limited thereto, and the second member 534 may be coupled to the other end of the reflection member 520. The second member 534 may include a plurality of second members 534. The plurality of second members 534 may be provided with a number corresponding to the number of plurality of reflection members 520. The plurality of second members 534 may be coupled to the plurality of reflection members 520, respectively.

The first member 532 may be coupled to the driving member 540. The first member 532 may be coupled to the driving member 540 and the second member 534. A plurality of second members 534 may be coupled to the first member 532. The first member 532 may receive the power from the driving member 540. The first member 532 may be moved in the vertical direction through the power provided from the driving member 540. In this case, the second member 524 coupled to the first member 532 may also be moved in the vertical direction. Through this, the reflection member 520 coupled to the second member 524 may be tilted at a predetermined angle. That is, as the connection member 530 is moved in the vertical direction by receiving the power from the driving member 540, the other end of the reflection member 520 may be moved in the vertical direction. The connection member 530 may tilt the reflection member 520 at a predetermined angle by receiving the power from the driving member 540.

Referring to FIGS. 3 and 4, the laser reflection unit 500 may include the driving member 540. The driving member 540 may move the reflection member 520. The driving member 540 may provide the power to the connection member 530. The driving member 540 may move the connection member 530 in the vertical direction. The driving member 540 may elevate the connection member 530. The first member 532 of the connection member 530 may be coupled to the driving member 540. The driving member 540 may provide the power to the first member 532. The driving member 540 provides the power to the first member 532 to move the first member 532 in the vertical direction. In this case, the plurality of second members 534 coupled to the first member 532 may be moved in the vertical direction, and the reflection member 520 coupled to the second member 534 may be tilted. For example, the driving member 540 may be provided as the motor. However, the present invention is not limited thereto, and even any component may be used, which are capable of moving the connection member 530.

Referring to FIG. 3, the laser reflection unit 500 may include a monitoring member 550. The monitoring member 550 may be provided at the upper portion of the substrate W supported on the substrate support unit 340. The monitoring member 550 may be provided as a camera or a vision that photographs the substrate W at the upper portion of the substrate W when the substrate W is heated by the laser irradiation unit 400. Alternatively, the monitoring member 550 may be provided as a temperature sensor that senses the temperature of the substrate W by the laser irradiation unit 400. The monitoring member 550 may measure the temperature for each zone of the substrate W. For example, the substrate W the center zone, the edge zone, and the middle zone disposed between the center zone and the edge zone, and the monitoring member 550 may measure the temperature heated for each zone of the substrate W.

Referring to FIG. 4, the laser reflection unit 500 may include a controller 560. The controller 560 receives temperature information of the substrate W from the monitoring member 550, and as a result, the controller 560 determines a zone for replenishing an insufficient temperature for each zone of the substrate W, and then controls an angle and/or a location of the reflection member 520 to control the temperature for each zone of the substrate. The controller 560 determines the zone for replenishing the insufficient temperature for each zone of the substrate W, and then controls the angle and/or the location of the reflection member 520 to replenish the amount of light inside the substrate W.

The controller 560 may include a determination unit 560 and a driving member control unit 564.

The determination unit 562 may receive the temperature information of the substrate W from the monitoring member 550. The determination unit 562 may analyze the temperature information of the substrate W from the monitoring member 550. The determination unit 562 may determine the zone in which the temperature should be replenished for each zone of the substrate W according to the temperature information of the substrate W received from the monitoring member 550. The determination unit 562 may determine the zone which is to be additionally heated for each zone of the substrate W according to the temperature information of the substrate W received from the monitoring member 550. The determination unit 562 may determine a zone in which the temperature is to be replenished in the zone of the substrate W, and then determine the angle or location of the reflection member 520. The determination unit 562 may transmit the determined location information of the reflection member 520 to the driving member control unit 564. The driving member control unit 564 may tilt the reflection member 520 according to the angle information and/or location information of the reflection member 520 determined by the determination unit 562. As a result, the heating temperature may be controlled for each zone of substrate W.

Hereinafter, a process in which the laser reflection unit 500 controls the reflection member 520 according to an exemplary embodiment of the present invention will be described in detail with reference to a drawing.

Figure 5:
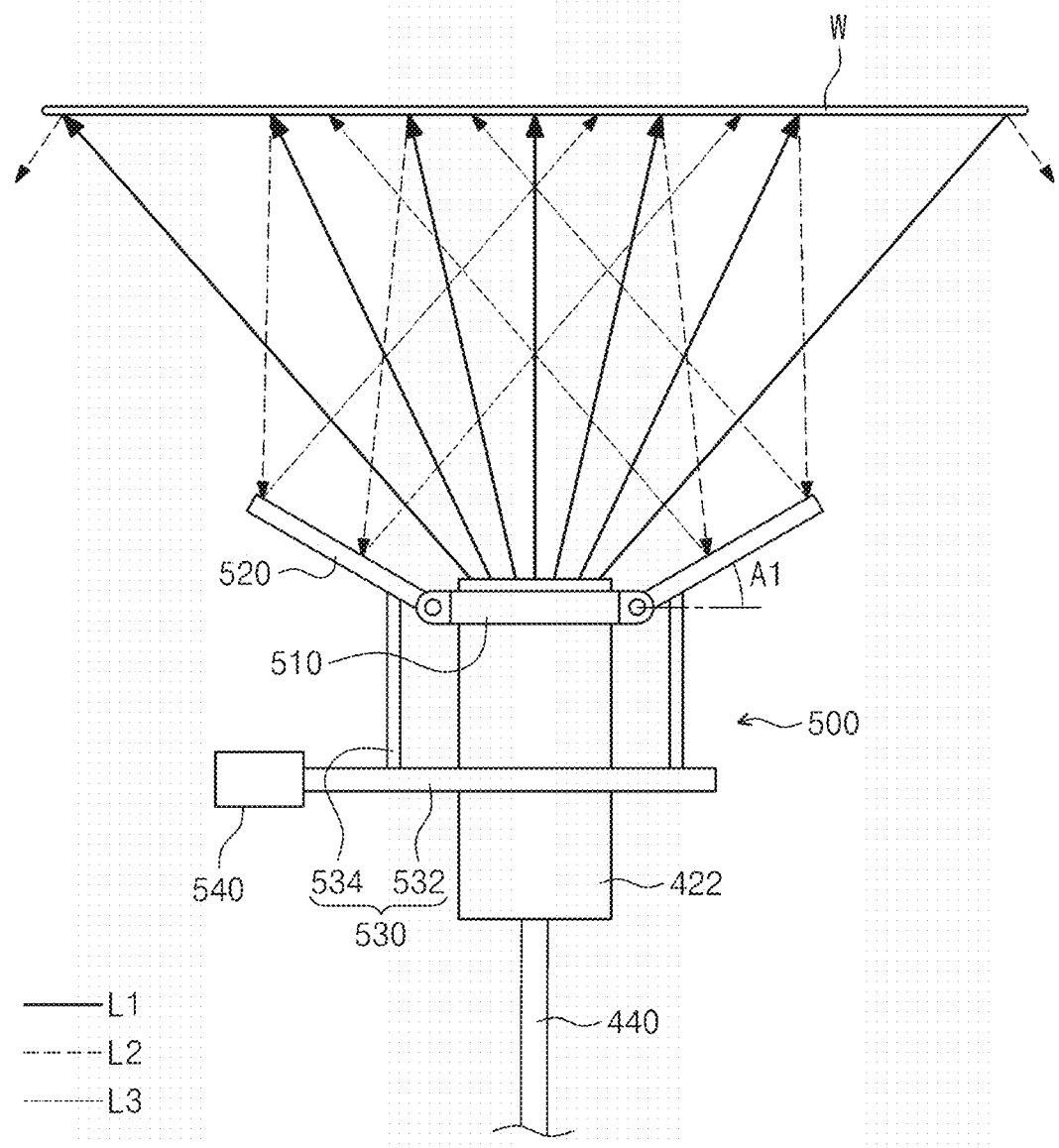
FIG. 5 is a diagram schematically illustrating a view in which a tilt angle of a reflection member is a positive angle according to an exemplary embodiment of the present invention.

FIG. 5 is a diagram schematically illustrating a view in which a tilt angle of a reflection member is a positive angle according to an exemplary embodiment of the present invention.

The reflection member 520 may be tilted at a predetermined positive angle A1 based on a virtual plane parallel to the top surface of the housing 422. The reflection member 520 may be tilted at a predetermined angle in a positive direction around the point where the reflection member 520 and the base 510 contact each other. The reflection member 520 may be tilted at a predetermined angle in the counterclockwise direction around the point where the reflection member 520 and the base 510 contact each other. In this case, an angle at which the reflection member 520 is tilted may be an angle defined by a virtual line of connecting the other end of the reflection member when the tilt angle is 0 degree, a point where one end of the reflection member 520 and the base 510 contact, and the other end of the tilted reflection member 520.

Referring to FIG. 5, the second laser L2 reflected from the bottom of the substrate W may be reflected by the reflection member 520, and may become the third laser L3. An angle at which the third laser L3 reflected by the reflection member 520 is reflected may be determined according to an angle on which the second laser L2 is incident on the reflection member 520, and a part of the third laser L3 may head to the bottom of the substrate W and the other part of the third laser L3 may not head to the bottom of the substrate W. In this case, when the controller 560 determines that the temperature replenishment of the substrate W is required according to the temperature of the substrate W, the controller 560 may tilt the reflection member 520 at a positive angle A1. As the reflection member 520 is tilted at the positive angle A1, the path of the third laser L3 may be controlled to a direction of heading to the bottom of the substrate W. Further, as a degree at which the reflection member 520 is tilted at the positive angle A1 becomes larger, the third laser L3 may be concentrated on the center zone of the bottom of the substrate W or a zone adjacent to the center zone.

Figure 6:
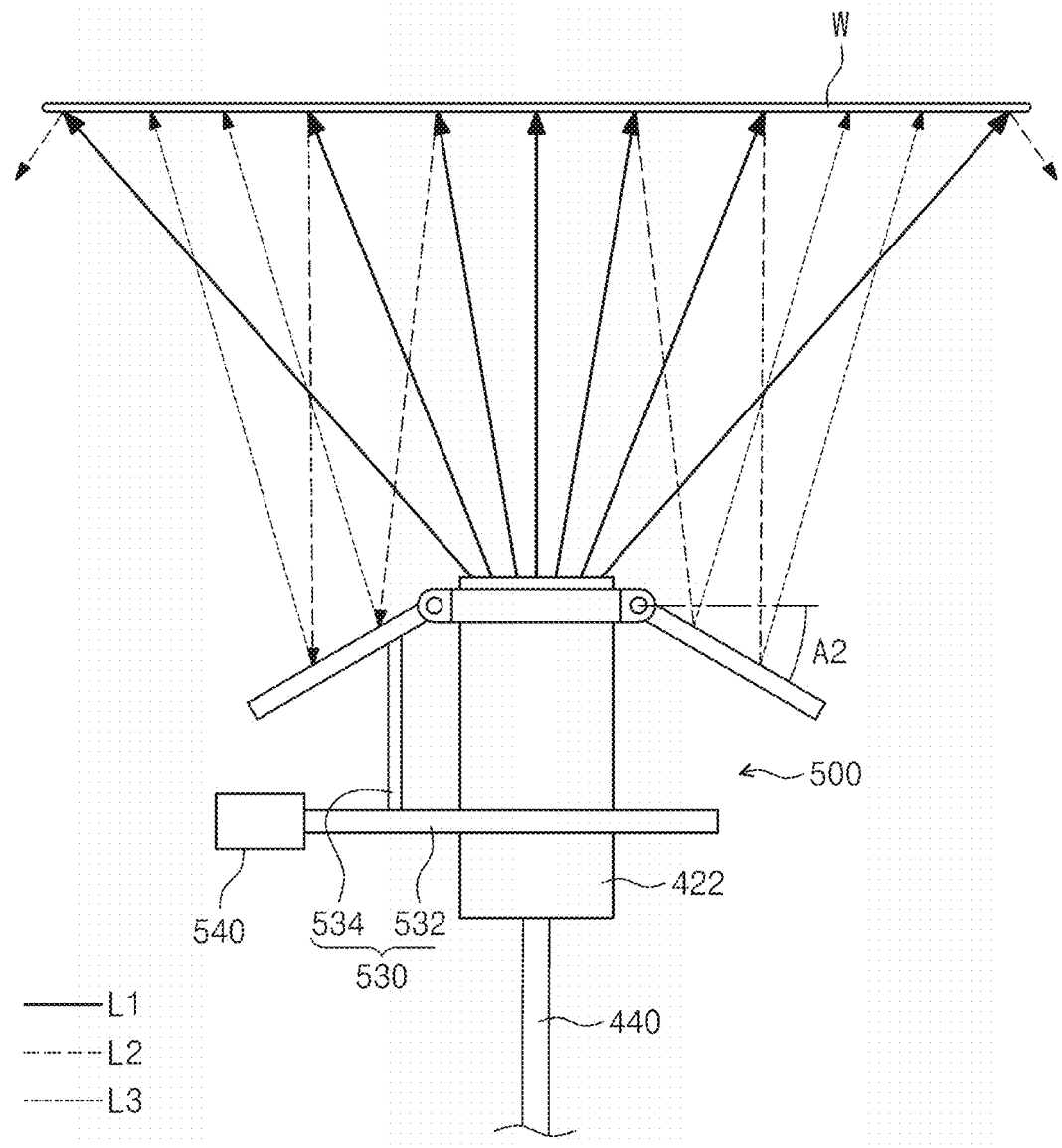
FIG. 6 is a diagram schematically illustrating a view in which the tilt angle of the reflection member is a positive angle according to an exemplary embodiment of the present invention.

FIG. 6 is a diagram schematically illustrating a view in which the tilt angle of the reflection member is a positive angle according to an exemplary embodiment of the present invention. The reflection member 520 may be tilted at a predetermined negative angle A2 based on the virtual plane parallel to the top surface of the housing 422. The reflection member 520 may be tilted at a predetermined angle in a positive direction around the point where the reflection member 520 and the base 510 contact each other. The reflection member 520 may be tilted at a predetermined angle in the clockwise direction around the point where the reflection member 520 and the base 510 contact each other. In this case, an angle at which the reflection member 520 is tilted may be an angle defined by a virtual line of connecting the other end of the reflection member when the tilt angle is 0 degree, a point where one end of the reflection member 520 and the base 510 contact, and the other end of the tilted reflection member 520. Referring to FIG. 6, the second laser L2 reflected from the bottom of the substrate W may be reflected by the reflection member 520, and may become the third laser L3. An angle at which the third laser L3 reflected by the reflection member 520 is reflected may be determined according to an angle on which the second laser L2 is incident on the reflection member 520, and a part of the third laser L3 may head to the bottom of the substrate W and the other part of the third laser L3 may not head to the bottom of the substrate W. In this case, when the controller 560 determines that the temperature replenishment of the substrate W is not required according to the temperature of the substrate W or the temperature replenishment at the edge zone of the substrate W is required more than the center zone of the substrate W, the controller 560 may tilt the reflection member 520 at the negative angle. As the reflection member 520 is tilted at the negative angle, the path of the third laser L3 may be controlled to a direction of not heading to the bottom of the substrate W or a direction of heading to the edge zone of the substrate W. Further, as a degree at which the reflection member 520 is tilted at the negative angle A2 becomes larger, the third laser L3 may be reflected in a direction of heading to a location which deviates from the substrate W.

Figure 7:
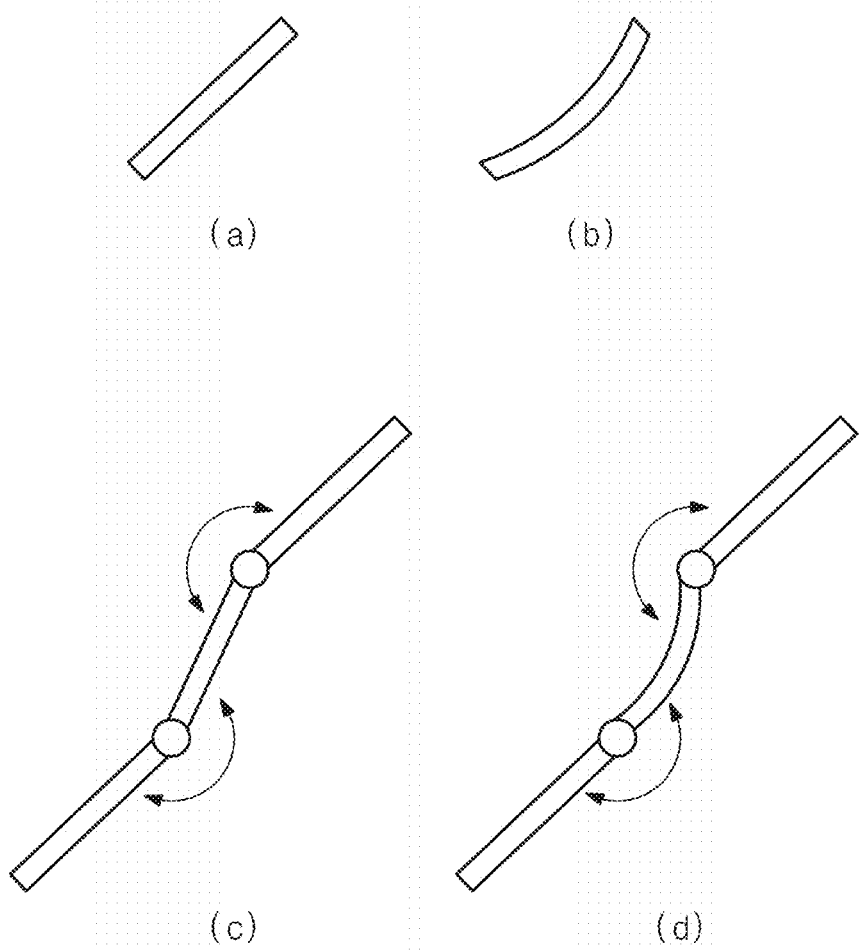
FIG. 7 is a diagram schematically illustrating various exemplary embodiments of the reflection member according to an exemplary embodiment of the present invention.

FIG. 7 is a diagram schematically illustrating various exemplary embodiments of the reflection member according to an exemplary embodiment of the present invention. The reflection member 520 may be provided in various shapes, and may not be limited to the shape. Referring to FIG. 7A, the reflection member 520 may be provided as the flat panel plate in which the upper surface and the lower surface are provided as a plane. Referring to FIG. 7B, the reflection member 520 may be provided as the round plate in which the upper surface and the lower surface are provided as a curved surface. When the reflection member 520 is provided as the round plate, the upper surface may be formed by a concave surface and the lower surface may be formed by a convex surface. In this case, the upper surface of the reflection member 520 means a surface facing the substrate and the lower surface of the reflection member 520 means a surface not facing the substrate W.

Referring to FIG. 7C, the reflection member 520 may be formed by coupling a plurality of flat panel plates. The plurality of flat panel plates may be pin-coupled to each other. The plurality of flat panel plates may be independently rotated around the pin. For example, when first to third flat panel plates are pin-coupled to each other in sequence, the first flat panel plate and the second flat panel plate may be rotated in the clockwise direction around the pin, and the second flat panel plate and the third flat panel plate may be rotated in the counterclockwise direction around the pin. However, the present invention is not limited thereto, and a rotational direction and a rotational degree may be determined according to a light amount replenishment degree into the substrate W.

Referring to FIG. 7D, in the reflection member 520, the plurality of flat plate plates and the plurality of round plates may be combined. The plurality of flat panel plates and the plurality of round plates may be pin-coupled to each other, respectively. The plurality of flat panel plates and the plurality of round plates may be independently rotated around the pin. For example, when the first flat panel plate, the round plate, and the second flat panel plate are pin-coupled to each other in sequence, the second flat panel plate and the round plate may be rotated in the clockwise direction around the pin, and the round plate and the second flat panel pate may be rotated in the counterclockwise direction around the pin. However, the present invention is not limited thereto, and a rotational direction and a rotational degree may be determined according to a light amount replenishment degree into the substrate W.

Figure 8:
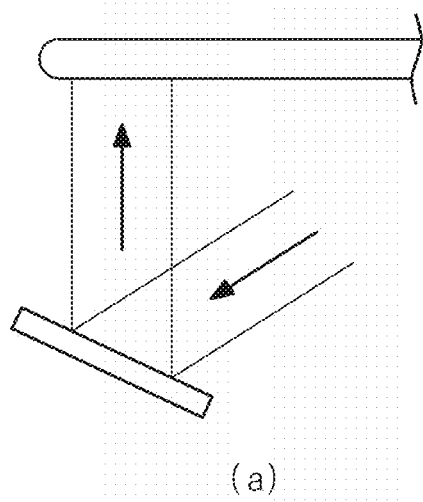
FIG. 8 is a diagram schematically illustrating a reflection path of a laser when the reflection member is provided as a flat panel plate and the reflection path of the laser when the reflection member is provided as a round plate.
Figure 8:
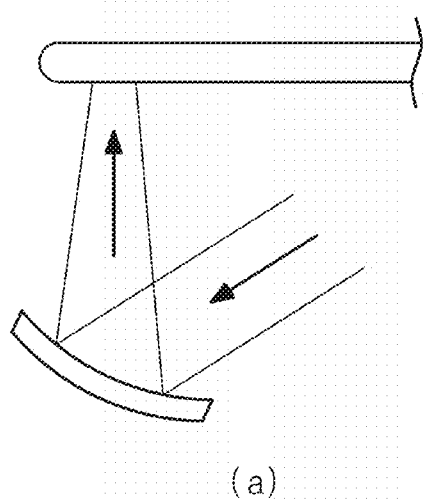

FIG. 8 is a diagram schematically illustrating a reflection path of a laser when the reflection member is provided as a flat panel plate and the reflection path of the laser when the reflection member is provided as a round plate.

Referring to FIG. 8, it can be seen that an intensity of the third laser L3 irradiated to the bottom of the substrate W when the reflection member 520 is provided as the round plate is higher than that when the reflection member 520 is provided as the flat panel plate. That is, when the reflection member 520 is provided as the round plate, the beam of the third laser irradiated to the bottom of the substrate W may be gathered, and as a result, the strength or intensity of the third laser L3 may be more sensitively controlled. Therefore, the reflection member 520 may be appropriately selected and applied as necessary by considering a set temperature at which the substrate W is to be heated, or the strength of a used laser.

Figure 9:
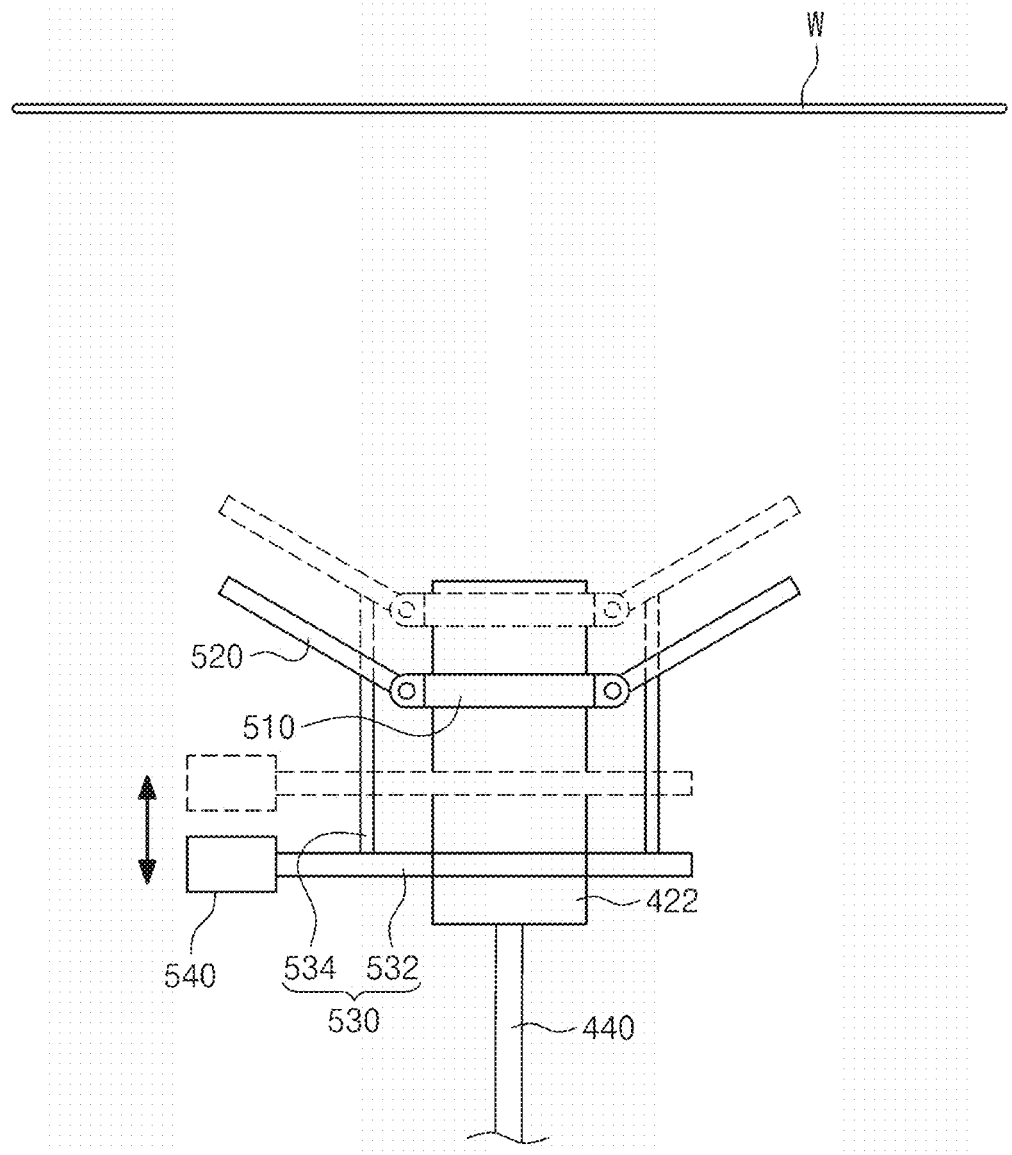
FIG. 9 is a diagram schematically illustrating a laser reflection unit according to another exemplary embodiment of the present invention.

FIG. 9 is a diagram schematically illustrating a laser reflection unit according to another exemplary embodiment of the present invention. The laser reflection unit 600 according to another exemplary embodiment of the present invention may be provided to have the same structure as the laser reflection unit 500 according to an exemplary embodiment. However, the laser reflection unit 600 according to another exemplary embodiment may be provided may be provided to tilt or vertically move the reflection member 520. Hereinafter, a difference from the laser reflection unit 500 according to an exemplary embodiment will be primarily described, and the same component is denoted by the same reference numeral, and a description thereof is omitted.

In the laser reflection unit 600 according to another exemplary embodiment, the reflection member 520 may be tilted to the base 510 at the predetermined angle as described above. Further, the reflection member 520 may be moved in the vertical direction. The plurality of reflection members 520 may be simultaneously moved in vertical direction. The reflection member 520 may be moved in the vertical direction jointly with the base 510 as the base 510 is moves along the outer surface of the housing 422 in the vertical direction. The controller 560 may move the base 510 and the reflection member 520 in the vertical direction according to the temperature replenishment degree of the substrate W or the light amount replenishment degree into the substrate W.

Figure 10:
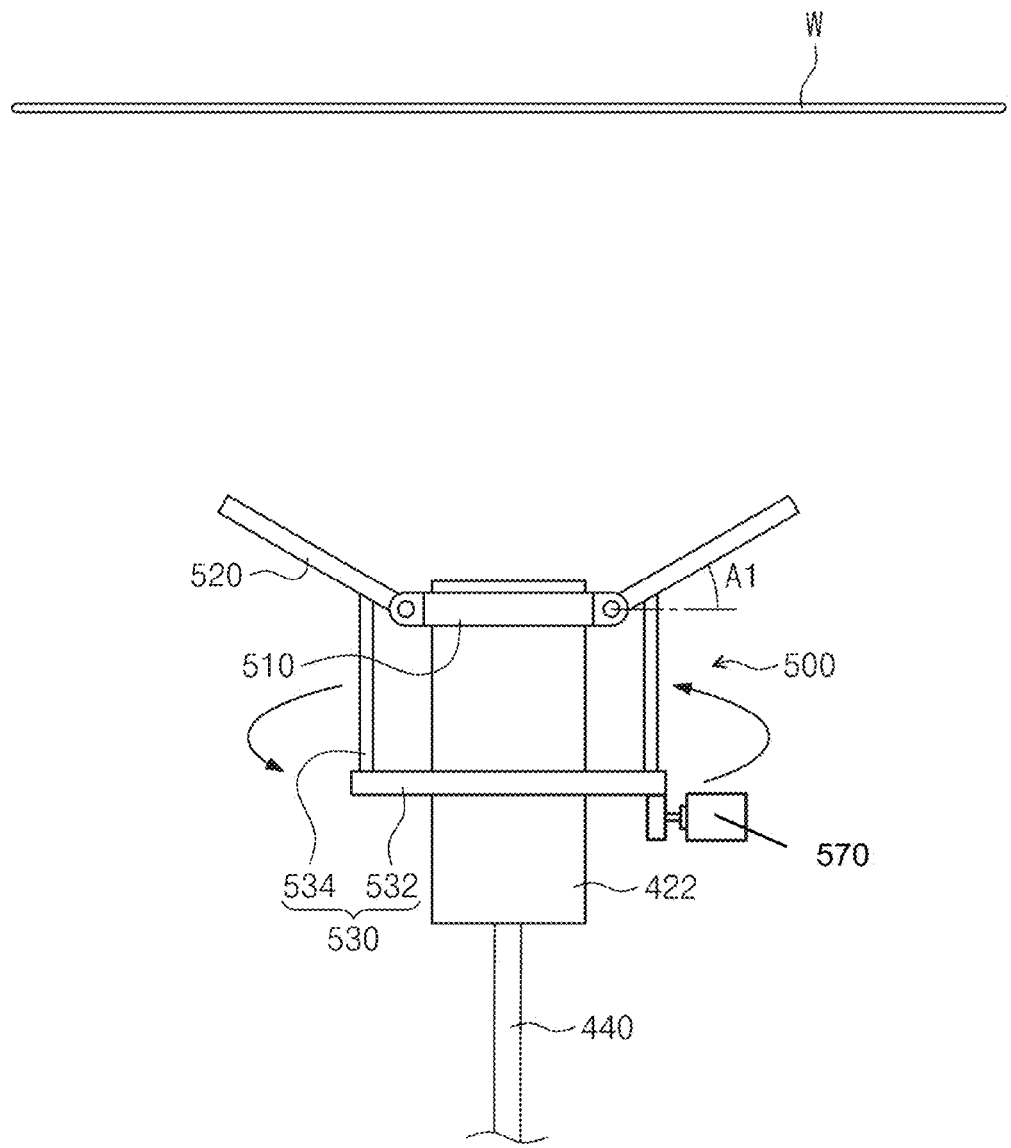
FIG. 10 is a diagram schematically illustrating a laser reflection unit 700 according to yet another exemplary embodiment of the present invention.

FIG. 10 is a diagram schematically illustrating a laser reflection unit 700 according to yet another exemplary embodiment of the present invention. The laser reflection unit 700 according to yet another exemplary embodiment of the present invention may be provided to have the same structure as the laser reflection unit 500 according to an exemplary embodiment except for the driving member 540. Hereinafter, a difference from the laser reflection unit 500 according to an exemplary embodiment will be primarily described, and the same component is denoted by the same reference numeral, and a description thereof is omitted. The laser reflection unit 700 ma include the base 510 coupled to the laser irradiation unit 400 and the reflection member 520 coupled to the base 510. The reflection member 520 may be tiltably coupled to the base 510 at the predetermined angle as described above. The reflection member 520 may be tilted to the base 510 at a predetermined positive angle A1 or a predetermined negative angle A2. As the reflection member 520 is tilted at the positive angle A1, a light amount of the third laser L3 reflected on the bottom of the substrate W in the third laser L3 may be increased. Further, as a tilt angle at which the reflection member 520 is tilted at the positive angle A1 is larger, the third laser L3 may be concentrated on the center zone of the substrate W. When the reflection member 520 is tilted at the negative angle A2, the third laser L3 may be reflected to the edge zone of the substrate W or the location which deviates from the substrate W. Further, as the degree at which the reflection member 520 is tilted at the negative angle A2 becomes larger, the light amount of the third laser L3 reflected to a zone which deviates from the substrate W may be increased. The controller 560 may control the tilt angle of the reflection member 520 according to the temperature of the substrate W. Meanwhile, the reflection member 520 may be rotated. The reflection member 520 may be rotated in the clockwise direction or the counterclockwise direction by the driving member 570. In this case, the reflectance of the laser may be increased.

The reflection member 520 may be coupled to the connection member 530 and the connection member 530 may be coupled to the driving member 570. In this case, the driving member 570 may be provided as the hollow motor. The driving member 570 may be provided as a motor having a hollow formed therein, and at least a part of the lens irradiation unit 400 may be disposed in the hollow. As a result, the driving member 570 may be rotated without an inference or collision with the lens irradiation unit 400, and the reflection member 520 may be rotated as the driving member 570 rotates.

In general, a structure of heating the substrate with the laser, a reflector fixed to a specific location may be used in order to return a laser beam reflected on the bottom and returned to the substrate again. In this case, since it is impossible to change an optical path of the laser beam reflected by the reflector due to fixation of the reflector, it is difficult to selectively concentrate light on the zone requiring the temperature replenishment of the substrate, so it is difficult to obtain a uniform etch rate.

However, according to the exemplary embodiment of the present invention, as the reflection member 520 that reflects the laser beam reflected on the substrate W and returned is provided to be variably tiltable, loss replenishment of the laser beam may be possible on the bottom of the substrate W. Further, as the optical path of the third laser L is changed so that the laser beam is concentrated on a zone having a lower temperature among the zones of the substrate W, it is possible to secure the uniform etch rate. Further, it is possible to replenish the temperature in an entire zone from the center zone up to the edge of the substrate W by controlling an angle value of the reflection member 520 which is variably tiltable.

The exemplary embodiment of the present invention may be modified to various application examples using a high-output annular laser beam for treating the substrate W, such as heating the substrate W. The process chamber may be not a chamber for cleaning or etching, but a different chamber performing heating. For example, the process chamber may also be an anneal chamber.

Meanwhile, a configuration, a storage, and a management of the controller according to the exemplary embodiments may be implemented in the form of hardware, software, or a combination of the hardware and the software. File data and/or software constituting the controller may be stored in volatile or nonvolatile storage devices such as a read only memory (ROM), etc., for example, or for example, a memory such as a random access memory (RAM), a memory chip, a memory device, or an integrated circuit, or storage media which are optically or magnetically writable or readable by a machine (e.g., a computer), such as a compact disk (CD), a digital versatile disc (DVD), a magnetic disk, or a magnetic tape, of course, regardless of whether to be deletable or re-writtable.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed embodiment. Further, the accompanying claims should be construed to include other exemplary embodiments as well.

What is claimed is:

1. An apparatus for treating a substrate, the apparatus comprising:
a chamber having a treating space;
a substrate support configured to support and rotate the substrate in the treating space;
a liquid supply configured to supply a chemical liquid to the substrate supported on the substrate support;
a laser irradiator configured to irradiate a laser to a bottom of the substrate supported on the substrate support; and
a laser reflector coupled to the laser irradiator, and configured to reflect a reflected laser reflected from the bottom of the substrate back to the bottom of the substrate,
wherein the laser reflector includes
a reflector plate configured to reflect the reflected laser, and
a driver configured to tilt the reflector plate at a tilt angle,
wherein the substrate support includes
a substrate driver provided as a hollow motor defining a hollow therein;
a chuck support having an internal space, and provided in a cylindrical shape in which an upper portion and a lower portion are opened;
a window coupled to a top of the chuck support, and disposed below the substrate supported on the substrate support; and
the hollow motor coupled to a lower end of the chuck support,
the laser irradiator is disposed at a location lower than the lower end of the chuck support; and
the laser irradiated from the laser irradiator is irradiated to the bottom of the substrate through the internal space of the chuck support,
wherein an inner diameter of the chuck support increases toward an upper end of the chuck support from the lower end of the chuck support, and
wherein the substrate driver is configured to rotate the substrate support.

2. The apparatus of claim 1, wherein the tilt angle can be a tilt angle from among a plurality of positive angles and negative angles, wherein the positive angles and negative angles are positive or negative, respectively, relative to a virtual plane parallel to a top of the substrate.

3. The apparatus of claim 2, wherein the reflected laser reflected from the substrate is reflected onto the reflector plate, and based on the reflector plate being tilted at one of the positive angles, the reflected laser is irradiated to the substrate.

4. The apparatus of claim 2, wherein based on the reflector plate being tilted at one of the negative angles, the reflected laser is reflected from the reflector plate to an edge zone of the substrate or a location which deviates from the substrate.

5. The apparatus of claim 1, wherein
the substrate includes a center zone, an edge zone, and a middle zone disposed between the center zone and the edge zone, and
the driver is configured to move the tilt angle to be a tilt angle from among a plurality of positive angles such that the laser reflected on the reflector plate is concentrated on the center zone of the substrate, wherein the positive angles are positive relative to a virtual plane parallel to a top of the substrate.

6. The apparatus of claim 1, wherein
the substrate includes a center zone, an edge zone, and a middle zone disposed between the center zone and the edge zone, and
the driver is configured to move the tilt angle to be a tilt angle from among a plurality of negative angles such that the laser reflected on the reflector plate is concentrated to be adjacent to the edge zone of the substrate or an outside of the substrate, wherein the negative angles are negative relative to a virtual plane parallel to a top of the substrate.

7. The apparatus of claim 1, wherein the reflector plate includes a plurality of reflector plates, and
the plurality of reflector plates are partially provided to overlap with each other in a vertical direction.

8. The apparatus of claim 7, wherein the plurality of reflector plates are integrally tilted.

9. The apparatus of claim 1, wherein the laser reflector includes
a monitor configured to monitor a temperature of the substrate at an upper portion of the substrate supported on the substrate support, and
a controller, and
the controller is configured to control the driver to control the tilt angle of the reflector plate based on the temperature of the substrate.

10. The apparatus of claim 9, wherein based on temperature replenishment into the substrate being required, the controller is configured to control the driver to control the tilt angle of the reflector plate to be a tilt angle from among a plurality of positive angles, wherein the positive angles are positive relative to a virtual plane parallel to a top of the substrate.

11. The apparatus of claim 1, wherein the driver is configured to move the reflector plate in a vertical direction while maintaining the tilt angle of the reflector plate.

12. The apparatus of claim 1, wherein at least a part of the laser irradiator is in the hollow of the hollow motor.

13. The apparatus of claim 1, wherein
the laser irradiator is disposed at a location lower than the lower end of the chuck support, and
the laser irradiated from the laser irradiator is irradiated to the bottom of the substrate through the internal space of the chuck support.

14. The apparatus of claim 1, wherein the reflector plate is entirely within a lower diameter of the chuck support such that the reflector plate does not overlap the chuck support in a vertical direction.

15. The apparatus of claim 1, wherein the reflector plate is coupled to the laser irradiator.

16. An apparatus for treating a substrate, the apparatus comprising:
a chamber having a treating space;
a substrate support configured to support and rotate the substrate in the treating space;
a liquid supply configured to supply a chemical liquid to the substrate supported on the substrate support;
a laser irradiator configured to irradiate a laser to a bottom of the substrate supported on the substrate support; and
a laser reflector coupled to the laser irradiator, and configured to reflect a reflected laser reflected from the bottom of the substrate back to the bottom of the substrate,
wherein the laser reflector includes
a reflector plate configured to reflect the reflected laser, and a driver configured to tilt the reflector plate at a tilt angle,
wherein the substrate support includes
a chuck support having an internal space, and provided in a cylindrical shape in which an upper portion and a lower portion are opened,
a window coupled to a top of the chuck support, and disposed below the substrate supported on the substrate support, and
a hollow motor coupled to a lower end of the chuck support,
the laser irradiator is disposed at a location lower than the lower end of the chuck support, and
the laser irradiated from the laser irradiator is irradiated to the bottom of the substrate through the internal space of the chuck support, and
wherein an inner diameter of the chuck support increases toward an upper end of the chuck support from the lower end of the chuck support.

17. An apparatus for treating a substrate, the apparatus comprising:
a chamber defining a treating space;
a substrate support configured to support and rotate the substrate in the treating space;
a liquid supply configured to supply a chemical liquid to the substrate supported on the substrate support;
a laser irradiator configured to irradiate a first laser to a bottom of the substrate supported on the substrate support and heat the substrate; and
a laser reflector coupled to the laser irradiator, and configured to reflect a second laser reflected from the bottom of the substrate,
wherein the laser reflector includes
a base coupled to an outer surface of the laser irradiator, and provided to cover the laser irradiator,
a reflector plate coupled to the base,
a driver tilting the reflector plate to the base, and
a connector including a first member coupled to the driver and a second member connecting the first member and the reflector plate,
the reflector plate includes a plurality of reflector plates, and
the plurality of reflector plates are coupled along a circumference of the base, and at least some of the plurality of reflector plates are disposed to overlap with each other.

18. The apparatus of claim 17, wherein the driver is configured to tilt each of the plurality of reflector plates at a tilt angle, and
the tilt angle is a positive angle or a negative angle, wherein the positive angle and negative angle is positive or negative, respectively, relative to a virtual plane parallel to a top of the substrate.

19. The apparatus of claim 18, wherein the laser reflector includes
a monitor configured to monitor a temperature of the substrate at an upper portion of the substrate supported on the substrate support and transmit the temperature of the substrate at the upper portion to a controller,
wherein the controller is configured to receive the temperature of the substrate at the upper portion from the monitor,
wherein the controller is configured to control the tilt angle of each of the plurality of reflector plates according to the temperature of the substrate at the upper portion received from the monitor, and
wherein based on temperature replenishment into the substrate being required, the controller is configured to control each of the plurality of reflector plates to be tilted at the positive angle.

20. The apparatus of claim 18, wherein the substrate includes a center zone, an edge zone, and a middle zone disposed between the center zone and edge zone, and
based on the tilt angle being provided as the positive angle, the second laser is reflected to the bottom of the substrate, and
based on the tilt angle being provided as the negative angle, the second laser is reflected to the edge zone of the substrate or a location which deviates from the substrate.

* * * * *